United States Patent [19]

Kister

[11] Patent Number: 5,764,072
[45] Date of Patent: Jun. 9, 1998

[54] DUAL CONTACT PROBE ASSEMBLY FOR TESTING INTEGRATED CIRCUITS

[75] Inventor: January Kister, Menlo Park, Calif.

[73] Assignee: Probe Technology

[21] Appl. No.: 771,274

[22] Filed: Dec. 20, 1996

[51] Int. Cl.⁶ ................................................ G01R 31/02
[52] U.S. Cl. ........................... 324/754; 324/757; 324/758; 324/761
[58] Field of Search .................................. 324/754, 757, 324/758, 755, 761, 762; 29/882; 439/482, 66

[56] References Cited

U.S. PATENT DOCUMENTS

| | | | |
|---|---|---|---|
| 3,849,728 | 11/1974 | Evans | 324/72.5 |
| 3,930,809 | 1/1976 | Evans | 29/203 J |
| 4,038,599 | 7/1977 | Bove et al. | 324/754 |
| 4,284,314 | 8/1981 | Lesyk | 339/75 M |
| 4,382,228 | 5/1983 | Evans | 324/72.5 |
| 4,423,376 | 12/1983 | Byrnes et al. | 324/756 |
| 4,837,622 | 6/1989 | Whann et al. | 324/72.5 |
| 5,055,777 | 10/1991 | Bonelli et al. | 324/754 |
| 5,230,632 | 7/1993 | Baumberger et al. | 439/66 |
| 5,248,262 | 9/1993 | Busacco et al. | 439/66 |
| 5,565,787 | 10/1996 | Perego | 324/755 |

*Primary Examiner*—Vinh P. Nguyen
*Assistant Examiner*—Russell M. Kobert
*Attorney, Agent, or Firm*—Lumen Intellectual Property Services

[57] ABSTRACT

An assembly for making electrical connections to unpackaged integrated circuits using dual contact probes. The probes are said to be dual contact because they contact both the integrated device under test and the testing circuit. The probes have two tips. One tip is located at the end of each leg of the "U"-shaped probe. In operation, the probes are oriented with the legs of the probes extending horizontally and the tips pointing up and down, contacting the IC under test and the testing circuit. The probes are each made of a single piece of metal, and so provide an electrical connection between the IC and testing circuit. Flexing in the legs provides springiness for assuring good contact. The probes are mounted on a rigid block that is rigidly connected to the testing circuit and IC under test. Alignment plates are used to accurately position the probes. The plates can be horizontal or vertical and they have holes or slots that engage parts of the probes. The holes and slots are placed to provide proper positioning of the probes.

17 Claims, 7 Drawing Sheets

DUAL CONTACT PROBE ASSEMBLY FOR TESTING INTEGRATED CIRCUITS

FIELD OF THE INVENTION

This invention relates to integrated circuit testing devices and, more specifically, to probe devices used for making electrical connections between unpackaged integrated circuits (IC's) to be tested and a testing circuit.

BACKGROUND OF THE INVENTION

An important aspect of the manufacture of integrated circuits (IC's) is the testing of an IC to verify that it operates properly. Although the circuit could be tested after it has been packaged, the expense involved in packaging the individual IC's makes it advantageous to test them as early as possible in the process so that unnecessary efforts will not be expended on faulty devices. Therefore, it is desirable that these circuits be tested either immediately after wafer fabrication is completed, and before separation into dice, or after dicing but before packaging. In either case, it is necessary to make electrical connection to all the circuits contact pads so that a testing apparatus can test the operation of the IC. The external contact pads on an IC die are extremely small and close together. Therefore, accurate, repeatable positioning is essential. Rapid, reliable contact must be made with all of the pads to properly test the IC.

Due to the high volume of IC's being produced, a probe testing apparatus may have to test thousands of IC's per day. Each test requires that multiple connections be made to the device under test (DUT). To ensure that solid electrical connections are made during each test, it is beneficial to have each probe tip gently scrape the connection pads upon contact to remove any insulating oxides. In this way, a clean metal surface is prepared which provides a low resistance connection. This scraping action results in wear to the probe tip, which consequently must be replaced periodically. It is therefore advantageous to have a probe assembly with easily replaceable probes or probe tips.

Due to the great variety of integrated circuits being produced, it is beneficial to have a probe assembly that is easily adaptable to different testing circuits in a manner that enables rapid interchange of testing circuits. Different testing circuits are required for each kind of IC to be tested. Test circuit interchange has typically been accomplished in the prior art by including electrical contacts on the probe cards upon which the probes are mounted. These electrical contacts are then connected to a test circuit with standard commercial electrical connectors. The probe pins are mounted radially around a hole in the card with the probe tips extending into the hole. The DUT is held in the center of the hole, where it contacts the probe tips. Such probe cards are described in a number of patents including U.S. Pat. Nos. 4,837,622 to Whann et al; 3,930,809, 3,849,728 and 4,382,228 to Evans; and 3,835,381 to Garretson et al. These probe cards do not offer a fast and convenient method for interchanging testing circuits.

Due to the high speed operation of today's IC's, high speed operation of test probes is also important. It is preferable that an IC be tested to the extremes of its design performance range. In particular, many of today's IC's are designed to operate with bandwidths exceeding 1 GHz, and operation of such circuits should be evaluated at these high frequencies. High frequency testing requires that the conductor lengths between the and testing circuit be as short as possible. Probe cards are limited in their high speed operation by their geometry and the physical distance they require between the testing circuit and the IC.

A number of probes using flexible membranes with conductive traces have been described in the prior art. In these devices a cavity is provided behind the membrane. When pressurized air is admitted to the cavity, the membrane bulges outward and presses the conductive traces against the pads. The conductive traces may be provided with bumps to enhance contact with the required pads on the wafer.

In the prior art, no single apparatus offers the simultaneous advantages of high frequency operation, ease of interchanging testing circuits and superior alignment accuracy and speed.

OBJECTS AND ADVANTAGES OF THE INVENTION

It is an object of the present invention to provide a multiple point contact probe for IC chips with improved mechanical alignment accuracy and alignment speed.

It is also an object of the present invention to provide a multiple point contact probe for IC chips that allows for simple and rapid interchange of testing circuits It is also an object of the present invention to provide a multiple point contact probe for IC chips that is compatible with high frequency operation.

SUMMARY OF THE INVENTION

The above stated objects are achieved with the use of dual contact probes which contact both the DUT and the testing circuit. Prior art probes contact just the DUT. The probes are made of metal and so establish an electrical connection between the DUT and the testing circuit.

The dual contact probes are U-shaped, with each of the 'legs' of the U shape ending in a probe tip. The tips are oriented to point in opposite directions. If oriented in the same direction as a "U" on this page, the probe tips would point right and left. The tips are the portions of the probes that contact the DUT and the testing circuit. One dual contact probe is needed for each contact pad on the DUT. The DUT and the testing circuit are positioned above and below one another with the contact pads for each facing each other. The dual contact probe assembly is between the DUT and testing circuit.

In use, a number of probes are aligned to be planar parallel. Planar parallel means that the planes defined by the individual probes are parallel. A parallel row of probes is required for each row of collinear contact pads on the DUT. The probes are held in place by being rigidly attached e.g., epoxied, to a mounting block. The midsection of the "U" shape is provided with a section designed to engage with the mounting block. For example, the mounting block may have a "tongue" which engages with a slot in the midsection of the probe. Holes can also be provided in the midsection which will allow for a pin to skewer all the probes in a row. A pin provides increased mechanical stability.

The mounting block is further attached to the testing circuit and the holder for the DUT. This assures that the probes will stay aligned with the contact pads of the testing circuit and DUT.

Alignment of the probes is an important consideration. They must be rigidly fixed in all dimensions and, of course, not allowed to rotate. For example, all the probe tips for the DUT and testing circuit each must lie in a plane so they press the contact pads with the same force. Precise alignment is achieved with the use of alignment plates. An alignment plate is rigid and thin; may be horizontal or vertical; and is constructed with slots or holes to engage and position parts of the probes. A horizontal alignment plate, for example, can be constructed with holes to allow the probe tips to penetrate the plane of the plate. If the probe tips and plate holes are sized accurately, the plates will provide precise alignment of the probe tips in the plane. A horizontal plate offers the ability of aligning probe tips that are not collinear. A vertical plate may be similarly employed to assure that all the probes in a row are equally spaced (or spaced appropriately). This can be done by cutting vertical rectangular holes in the vertical plate. The holes are cut so that both legs of each probe slide into each hole. In this way, the spacing between each probe can be accurately and simply fixed.

DESCRIPTION OF THE FIGURES

All the drawing figures refer to this invention.

DETAILED DESCRIPTION

Figure 2:
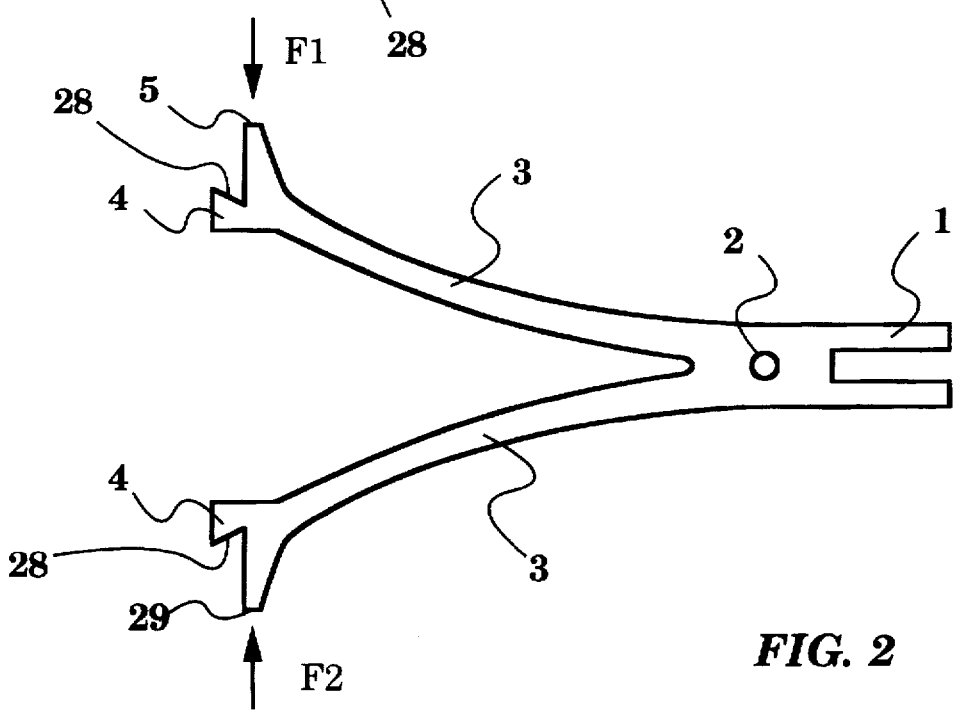
FIG. 2 is a side view of an individual dual contact probe.

An individual dual-contact probe is shown in FIG. 2. One such probe is necessary for each contact pad 13 on the device under test (DUT) 14, as shown in FIGS. 5, 8, 9, and 11. FIG. 2 shows the essential features of the preferred embodiment of a dual contact probe. These features are:

a mounting section 1
a through hole 2
beams or legs 3
heels 4
probe tips 5, 29
sloped edge of heel 28

The probe tips 5, 29 are the parts that contact the DUT contact pads 13 and testing circuit contact pads 27, as shown in FIGS. 5, 8, 9, and 11. The probes are made from a single piece of metal and so provide a path for electrical signals to travel between the DUT 14 and testing circuit 15. It can be correctly inferred from this drawing that the DUT 14 and testing circuit 15 are located on opposite sides of the dual-contact probe 6. F1 and F2 represent the forces imposed on the probe tips 5, 29 by the contact pads 27, 13 of the testing circuit 15 and DUT 14. It is noted that the dual contact probes 6 can have a variety of shapes and still be within the scope of this invention. FIGS. 10A and 10B show two particular probe shapes which are within the scope of this invention. Other useful shapes will be apparent upon understanding the operation of this invention.

It is noted that the probes 6 are 1.5 mm long from tip 5, 29 to mounting section 1 and 1.0 mm from probe tip 5 to probe tip 29. The probe tips 5, 29 have contact surfaces which are approximately 1.2 mils×1.0 mils (1/1000 of an inch). Preferred metals for the probes are beryllium copper, tungsten or 3% rhenium tungsten because they have good resistance to oxidation, are good conductors, are resilient and 'springy', and have good wear properties. The probes may be coated with chromium or other metals to further enhance oxidation resistance. Oxidation resistance is an important consideration because oxide films on the probe tips 5, 29 can result in poor electrical connections.

Figure 1:
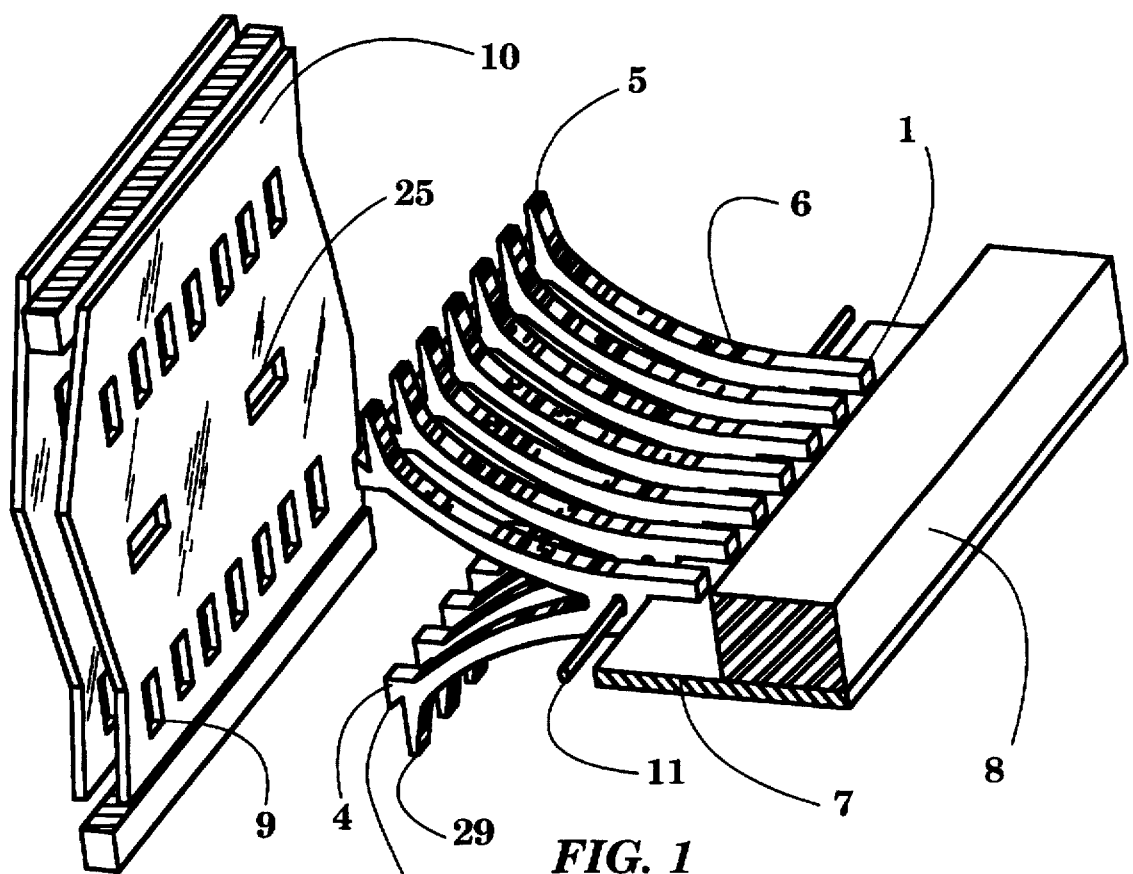
FIG. 1 is a perspective view of a vertical alignment plate, a row of probes and a mounting block.

A preferred embodiment of the invention is shown in FIG. 1. FIG. 1 shows a row of dual contact probes 6 attached to a mounting block tongue 7 which is attached to a mounting block 8. In this embodiment, the probes 6 have heels 4 next to each probe tip 5, 29. The heels 4 engage with vertical slots 9 (holes) in the alignment plate 10. The mounting section 1 of the probes 6 have a slot that fits over the mounting block tongue 7. In the preferred embodiment, the probe legs 3 must be squeezed together slightly to fit the heels 4 into the vertical slots 9. Therefore, the probes 6 are capable of holding onto the alignment plate 10 without adhesives. To prevent the heels 4 from sliding out of the vertical slots 9 in the plate 10, the heels 4 are provided with a sloped edge 28. The combination of sloped heel edge 28 and springy probe legs 3 locks the probes 6 into the plate 10. After the probes 6 are attached to the alignment plate 10, they are properly aligned and ready to be glued with epoxy to the mounting block tongue 7. A pin 11 is passed through the through holes 2 of all the probes 6 and helps to stabilize them. The pin 11 may also be epoxied to the probes 6. In the preferred embodiment, the alignment plate 10 is removed after gluing but before testing. In an alternative embodiment, the alignment plate 10 is left attached to the probes 6 during testing. Drawing FIG. 1 omits several essential components for clarity. Not shown is the DUT 14, the testing circuit 15, and additional parts of the mounting block 8.

Figure 3:
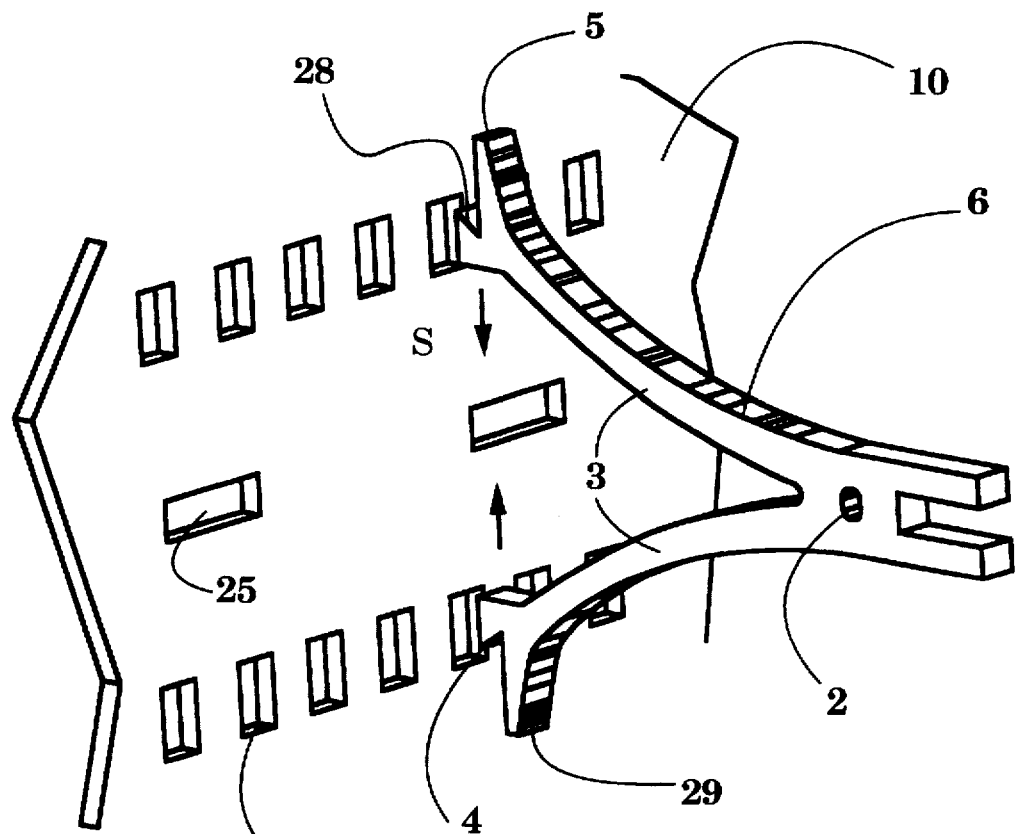
FIG. 3 shows a probe with heels engaging a vertical alignment plate.

FIG. 3 shows a close-up view of a single probe 6 with heels 4 about to engage a vertical alignment plate 10. Force S represents the force necessary to squeeze the probe legs 3 together to fit the heels 4 into the vertical slots 9 of the plate 10. Clearly shown in this drawing are the probe tips 5, 29, through hole 2 for the pin 11, mounting section of the probe 1, the probe legs 3 and the vertical slots 9 of the alignment plate 10. It can be seen from FIGS. 1 and 3 that the vertical alignment plate 10 accurately positions the probe 6.

Figure 4:
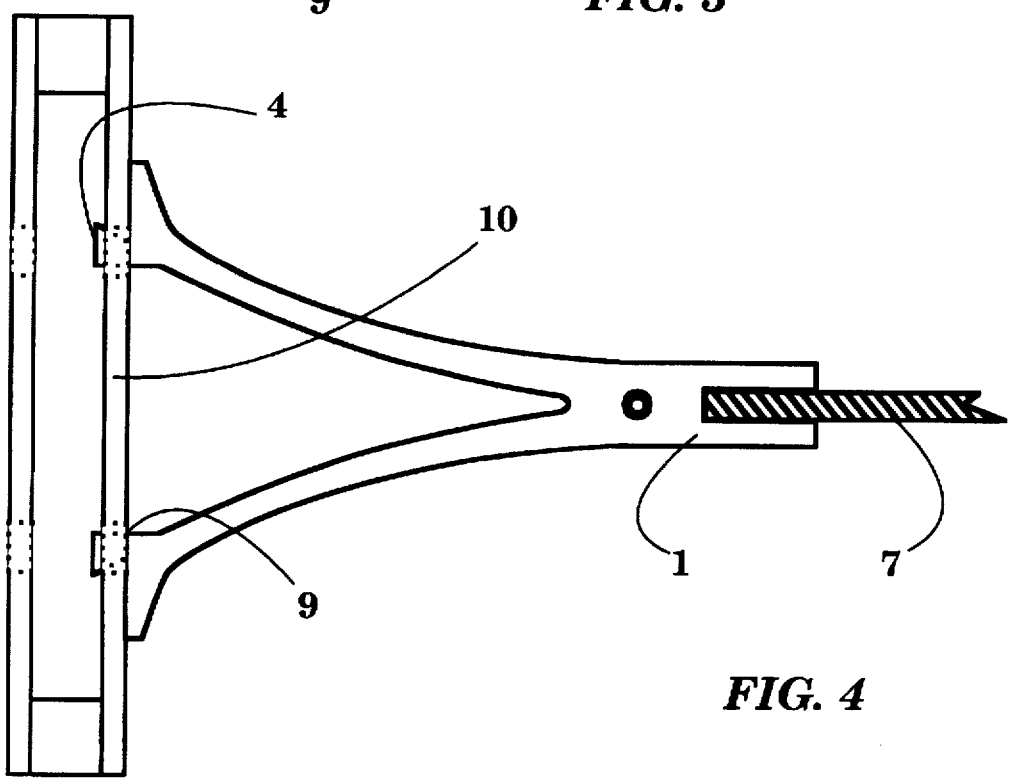
FIG. 4 is a side view of a probe with heels engaging a vertical alignment plate.

FIG. 4 shows a side view of a probe 6 with heels 4 fully engaged in the vertical slots 9 of a vertical alignment plate 10. Also shown in FIG. 4 is a clearer view of how the mounting block tongue 7 engages with the mounting section 1. FIGS. 1 and 4 show the alignment plate 10 having two layers. A two layer alignment plate 10 is more rigid than a single layer alignment plate 10 shown in FIG. 3. Also, a two layer alignment plate holds the probes 6 parallel to each other and perpendicular to the plane of the plate 10, which is the preferred orientation.

Figure 7:
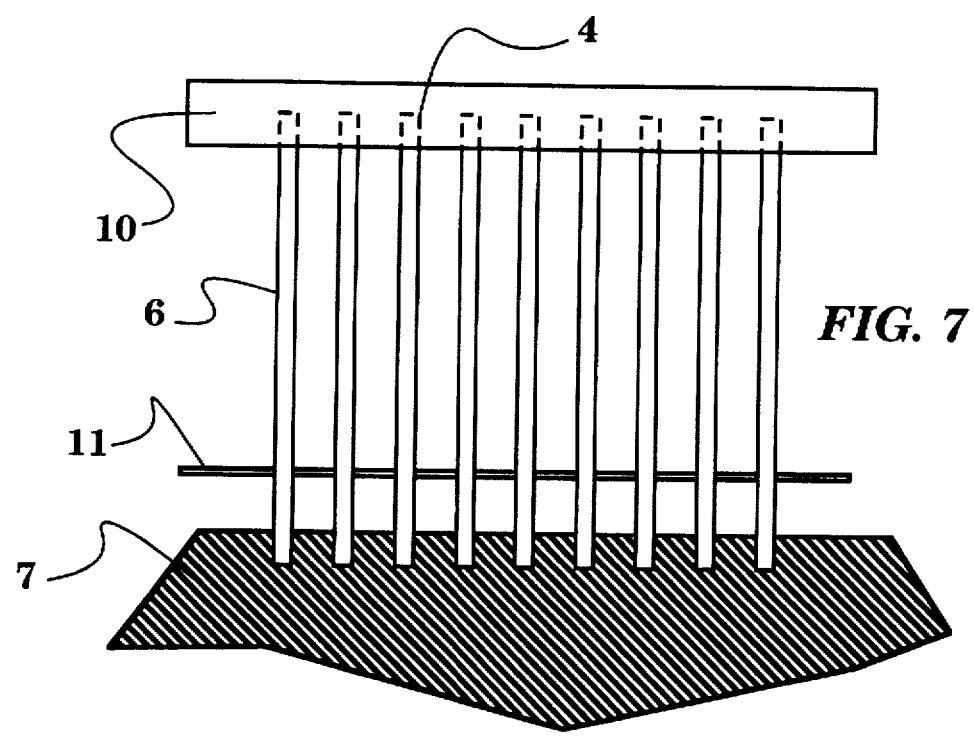
FIG. 7 is a top view showing dual contact probes, mounting pin, vertical alignment plate and mounting block tongue.
Figure 8:
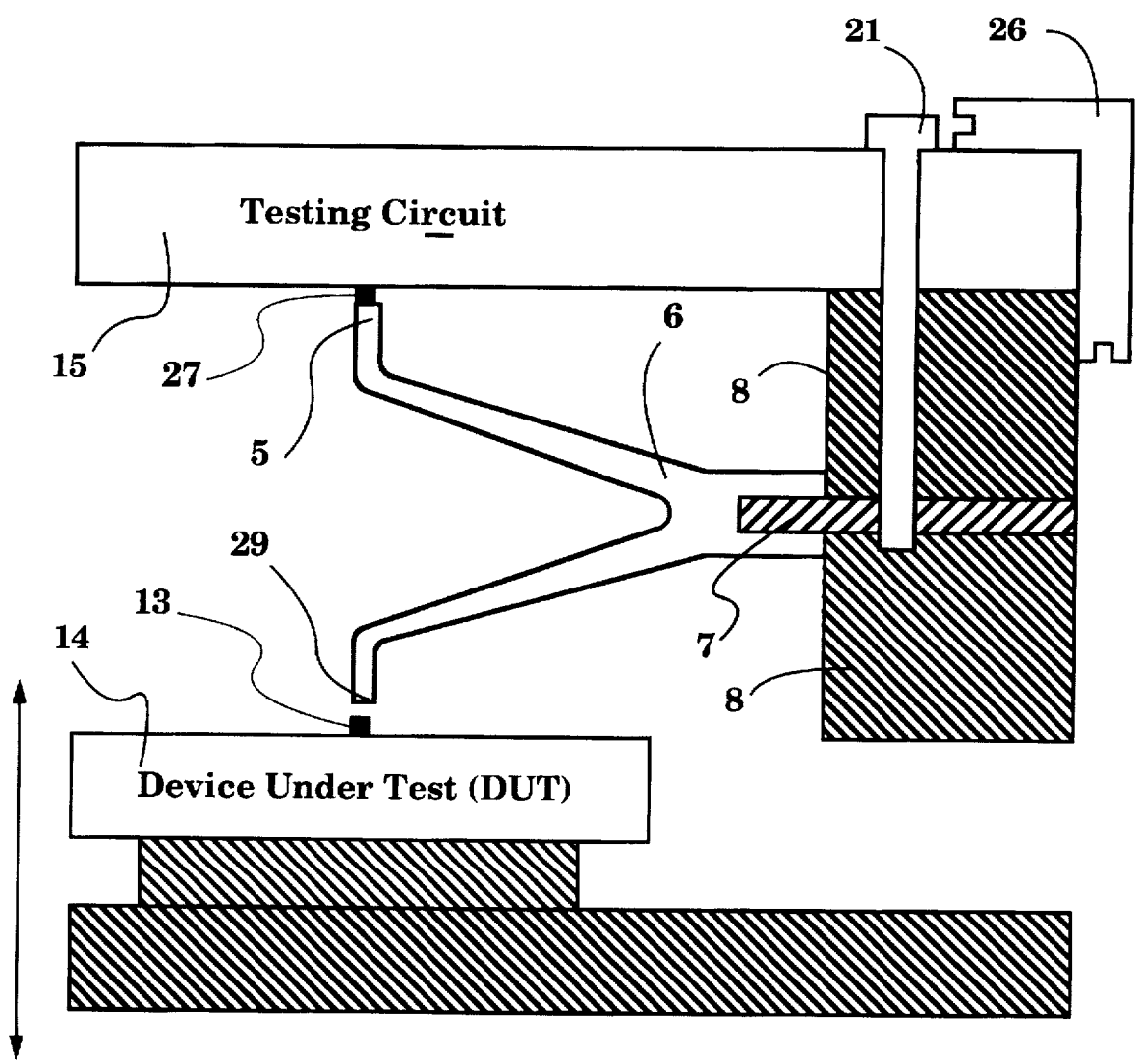
FIG. 8 shows a side view of a dual contact probe, mounting block tongue, and beams for mounting DUT and testing circuit.

FIG. 7 shows a top view of the invention. Visible in this drawing are 9 probes 6 (seen edge-on), the pin 11, the mounting block tongue 7 , the heels 4, and the vertical alignment plate 10.

When integrated circuits are the devices under test (DUT's 14), the probe assembly will have probes 6 positioned in the same pattern that the contact pads 13 are positioned on the DUT 14. Usually, the contact pads of an IC are located around the perimeter of the square or rectangular IC chip. Thus FIG. 1 only shows one of four rows of probes needed for contacting the typical IC chip.

Figure 11:
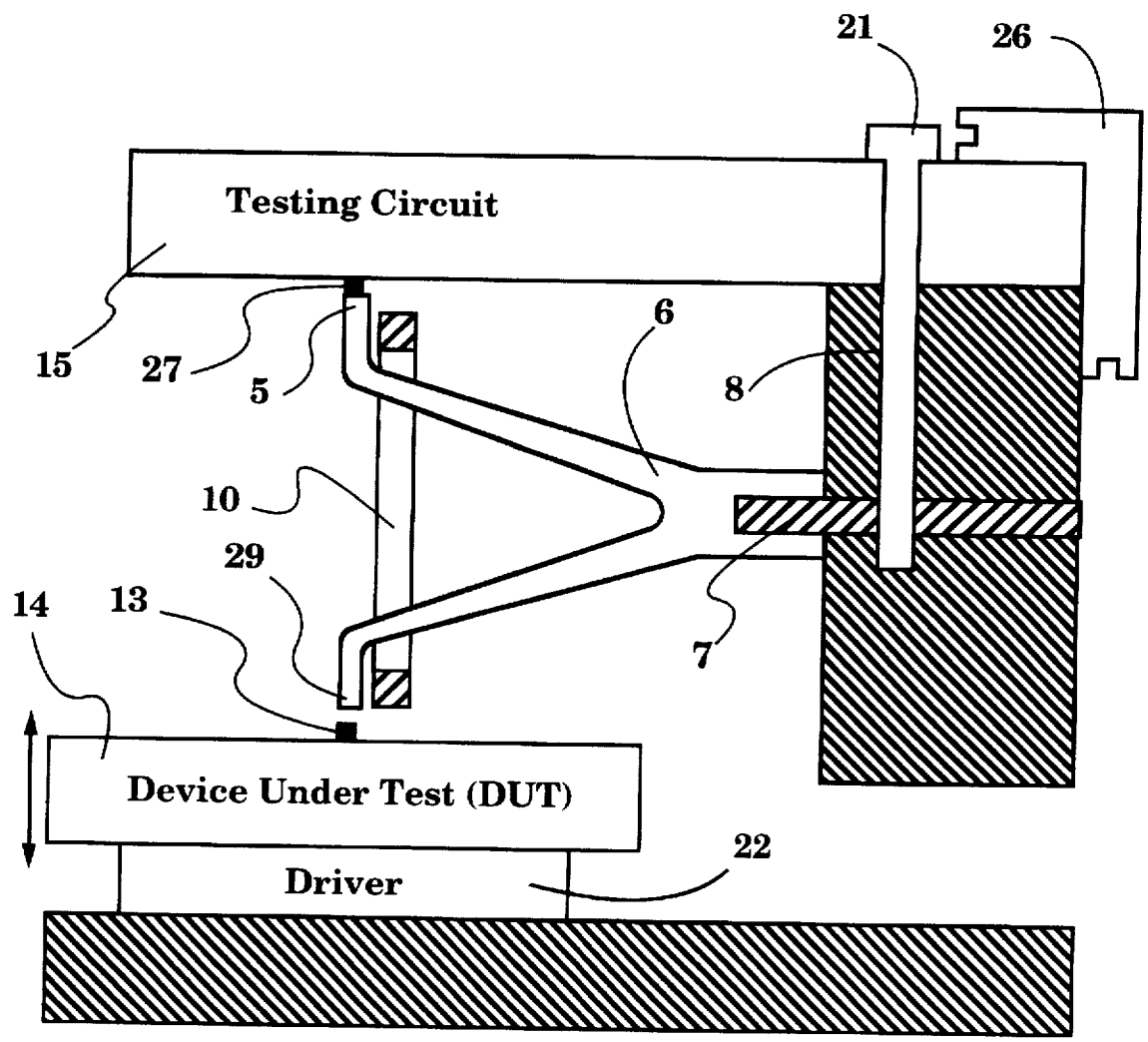
FIG. 11 shows a side view of a probe with a cross section of a vertical alignment plate.
Figure 12:
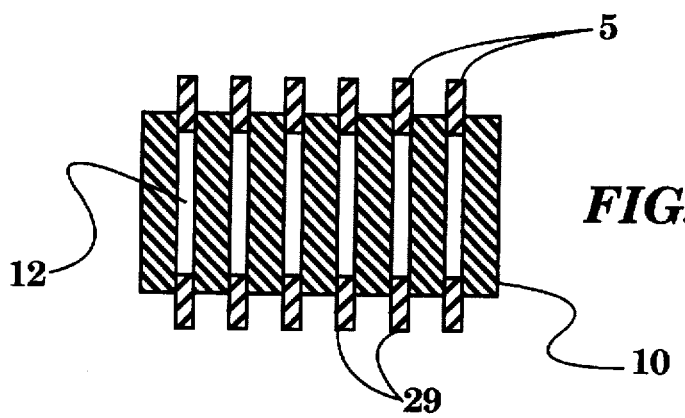
FIG. 12 shows a side view of the alignment plate and probe of FIG. 11.

Another form of vertical alignment plate 10 that does not require the probe to have heels is shown in FIG. 11. This drawing is a cross-sectional side view of a probe 6 and vertical alignment plate 10 shown in the assembly. The plate 10 has elongated rectangular holes 12 oriented with the long axis vertical. The cross-sectional view cuts through one of these holes. FIG. 12 shows an end view facing the alignment plate 10. The probe tips 5, 29 can be seen where they extend through the rectangular holes 12 in the alignment plate 10. When the probe tips 5, 29 contact the contact pads 13, 27, the probe tips 5, 29 are free to flex towards one another. The alignment plate 10 helps to maintain proper alignment. The alignment plate 10 cannot be removed from the probes 6 once the probes 6 are glued to the mounting block 8 and mounting block tongue 7. In this embodiment the plate 10 is intended to be left in situ during testing of DUT's 14.

Figure 9:
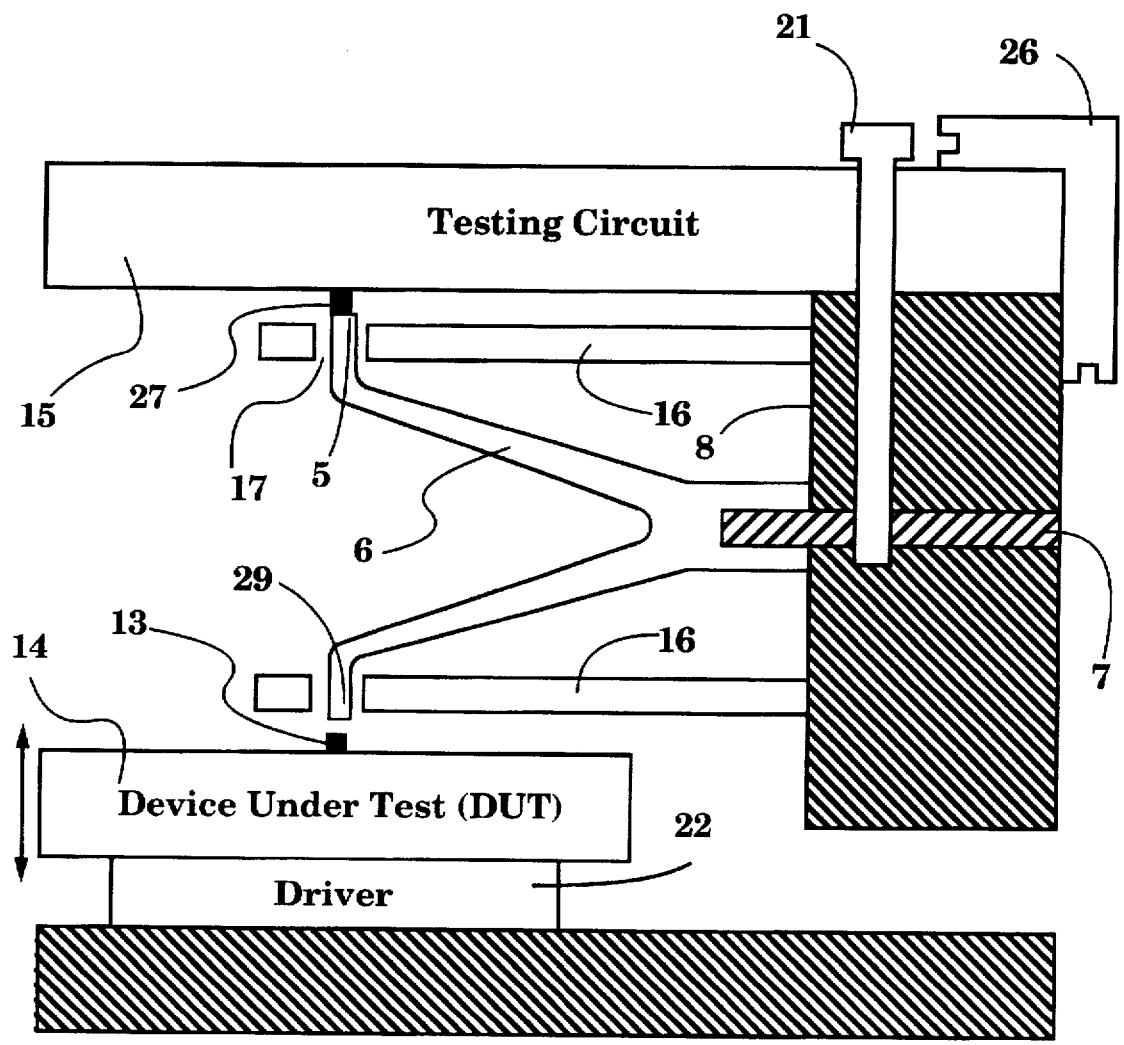
FIG. 9 is a side view showing a dual contact probe bonded to the mounting block tongue, and a pair of horizontal alignment plates.
Figure 10A:
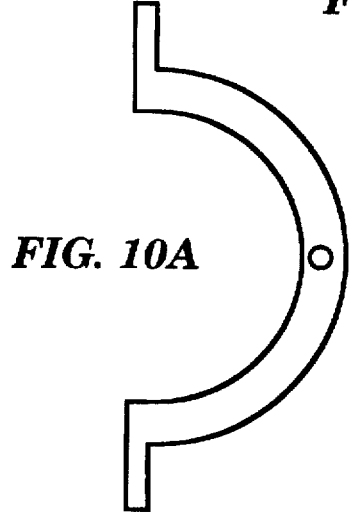
FIGS. 10a–10b show different possible embodiments of the dual contact probes.
Figure 10B:
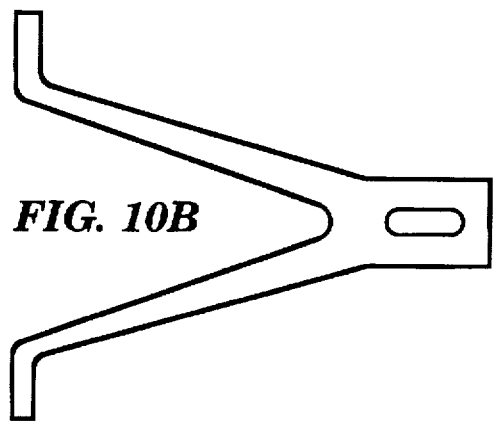

Horizontal alignment plates 16 as shown in FIG. 9 can also be used. A horizontal alignment plate 16 has holes 17 in the same respective locations as the DUT contact pads 13 and testing circuit contact pads 27. The probe tips 5, 29 stick through the holes 17. Separate horizontal alignment plates 16 for the DUT 14 and testing circuit 15 may be used. Vertical and horizontal alignment plates can be used together to position the probes 6. The horizontal alignment plates 16 can be left in the assembly during testing of DUT's 14 or removed after gluing probes 6 to the mounting block tongue 7.

Figure 6:
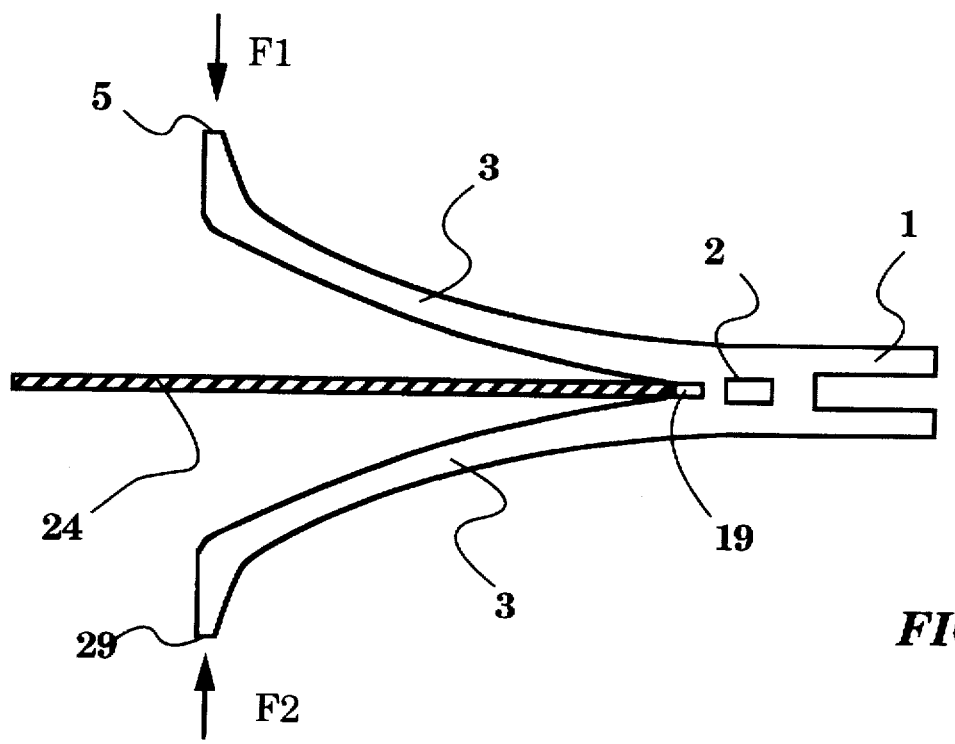
FIG. 6 is a side view of a single dual contact probe shown engaged with a lateral locator plate.

Another form of horizontal alignment plate, called a lateral locator plate (LL plate) 24 is shown in FIG. 6 and is a preferred embodiment of this invention. The LL plate 24 fits into the crotch of the probe 6 where a slit 19 is provided. This LL plate 24 may be particularly useful where a square or rectangular probe array is considered. In this case the LL plate 24 is made square or rectangular and the probes 6 are positioned around the perimeter. The LL plate 24 can be left in situ or removed after gluing probes to the mounting block tongue 7. The LL plate 24 may also extend into the region between the mounting sections 1 of the probes 6 in a probe row. The LL plate 24 can easily be used in conjunction with a vertical alignment plate 10, be it the kind that has vertical slots 9 as in FIG. 1 or the kind that has elongated rectangular holes 12 as in FIG. 11. When lateral locator plates 24 are used together with vertical alignment plates 10 it is beneficial to include horizontal slots 25 in the vertical alignment plate 10 which can accept parts of the lateral locator plates 24. Such slots 25 are shown in FIGS. 1 and 3.

An embodiment where the alignment plates 10, 16 or LL plates 24 are secured to a fixed object in the assembly can provide the advantage that the probe tips 5, 29 will be less prone to drifting out of alignment. An example of this embodiment is shown in FIG. 9. In this drawing the horizontal alignment plates 16 are shown bonded to the mounting block 8. Since the plate 16 is fixed over the testing circuit contact pads 27, the holes 17 act as guides for the probe tips 5, 29.

It is noted that the alignment plates 10, 16 and lateral locator plates 24 can be made of metal such as tungsten or heat treated beryllium copper, plastic such as polyamide, or ceramic such as alumina. An advantage of tungsten and beryllium copper is that these materials can be chemically etched to accurately form the holes 17, 12 necessary. In some embodiments of this invention, the alignment plate(s) 10, 16 or lateral locator plates 24 are left in situ while the probe assembly is testing DUT's 14. In this way, the plates 10, 16, 24 continue to provide alignment for the probes while in operation. When left in situ, the plates 10, 16, 24 must be made of an insulating material or have insulating sections or coating so that the probes are not electrically connected through the plate. The plates must also be made thin to accommodate the small dimensions of the probes. Typical thicknesses for the plates 10, 16, 24 are 1–5 thousandths of an inch.

In all the embodiments it is necessary to bring the DUT contact pads 13 and testing circuit contact pads 27 in contact with the probe tips 5, 29. It is preferable to leave the probe tips 5 in contact with the testing circuit contact pads 27 in between tests as it is presumed that many identical DUT's 14 will be tested sequentially. The testing circuit 15 is detachable from the mounting block 8 to facilitate simple interchange of testing circuits 15. A mounting device such as a clamp 26 or bolt 21 is shown in FIGS. 5, 8, 9, and 11 which enables rapid interchange and alignment of different testing circuits 15. This invention requires a driver 22 to move the DUT 14 up to contact the probe tips 5. This driver 22 may be an electromechanical actuator.

Figure 5:
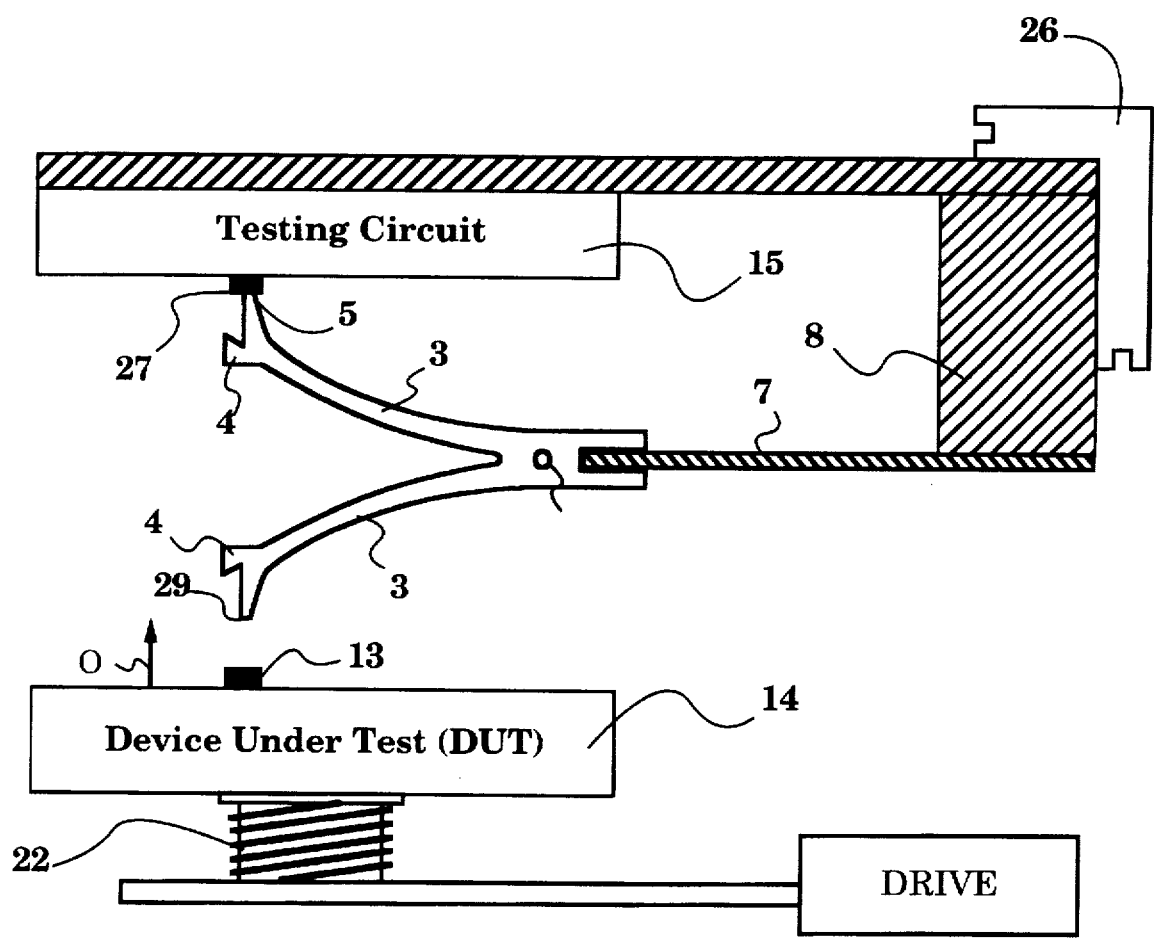
FIG. 5 is a side view of entire assembly, showing dual contact probe, device under test (DUT), mounting block, testing circuit and mounting block tongue.

FIG. 5 is a side view of the invention with all the essential components shown. The driver 22 is the device that moves the DUT 14 in the direction of arrow O until the DUT contact pads 13 contact the probe tips 29. The DUT contact pads 13 are aligned with the probe tips 29. When contact is made, overdrive is applied which presses the DUT contact pads 13 against the probe tips 29. The legs 3 of the probes 6 flex, and this results in a gentle scraping motion of the probe tips 29 across the DUT contact pads 13. This scraping motion is important because it removes oxide layers on the DUT contact pads 13 which can interfere with good electrical contact. The mounting block tongue 7, preferably made of ceramic, is rigid and so does not flex when the probe tips 29 contact the DUT contact pads 13. This provides for independent flexing in the two legs 3 of the probe. Independent flexing of probe legs 3 is beneficial for the following reasons:

1. Independent flexing prevents contact pressure between probe tips 29 and DUT pads 13 from interfering with contact between pads 27 and tips 5.
2. Sustained contact pressure between tips 5 and pads 27 helps the probes 6 stay aligned while testing thousands of DUT's 14.
3. By keeping the probe tips 5 in contact with pads 27, premature wearout of pads 27 is prevented. This is beneficial because replacement of the testing circuit 15 is costly.

In FIG. 5 the probe is shown attached to the mounting block tongue 7 which is attached to the mounting block 8. Also attached to the mounting block 8 is the testing circuit 15. No alignment plates are shown because this embodiment only uses alignment plates for the initial alignment step. They are removed before any IC's are tested.

It will be clear to one skilled in the art that the above embodiments may be altered in many ways without departing from the scope of the invention. For example, the mounting block tongue may be omitted and the probe bonded directly to the mounting block. Accordingly, the scope of the invention should be determined by the following claims and their legal equivalents.

What is claimed is:

1. A circuit testing mechanism for simultaneously contacting contact pads of a DUT and maintaining contact with contact pads of a testing circuit by using dual-contact probes, said dual-contact probes having a mounting section from which extends a first beam terminating in a first tip portion and a second beam terminating in a second tip portion, said circuit testing mechanism comprising:

a) a mounting block for fixedly mounting said dual-contact probes by said mounting section such that said first beam and said second beam experience independent flexure under the application of a contact force to said tip portions, and such that said first beam and said second beam extend away from said mounting block;

b) a means for positioning said testing circuit such that said the contact pads of said testing circuit maintain contact with said first tip of said dual-contact probes; and c) a means for driving said DUT such that the contact pads of said DUT come in contact with said second tip of said dual-contact probes.

2. The circuit testing mechanism of claim 1 wherein said dual-contact probes are substantially U-shaped, said first beam and said second beam constituting the legs of the U-shape.

3. The circuit testing mechanism of claim 1 further comprising a mounting block tongue.

4. The circuit testing mechanism of claim 1 further comprising at least one alignment plate.

5. The circuit testing mechanism of claim 1 wherein at least one of said alignment plates is oriented vertically.

6. The circuit testing mechanism of claim 1 wherein at least one of said alignment plates is oriented horizontally.

7. The circuit testing mechanism of claim 1 wherein at least one of said alignment plates is removable.

8. The circuit testing mechanism of claim 1 wherein said alignment plate has vertical slots and said first tip portion and said second tip portion have heels for placing into said vertical slots.

9. The circuit testing mechanism of claim 8 wherein said heels have a sloped edge for wedging into said vertical slots.

10. The circuit testing mechanism of claim 1 wherein said alignment plate has horizontal slots for receiving lateral locator plates.

11. The circuit testing mechanism of claim 10 wherein said mounting section of said dual-contact probes has a slit for engaging said lateral locator plates.

12. The circuit testing mechanism of claim 10 wherein said lateral locator plates extend in-between mounting sections of said dual-contact probes.

13. The circuit testing mechanism of claim 1 wherein said dual-contact probes have a through-hole in said mounting section for receiving a pin to stabilize said dual-contact probes.

14. The circuit testing mechanism of claim 1 further comprising epoxy for mounting said dual-contact probes on said support block.

15. The circuit testing mechanism of claim 1 further comprising a clamping device for removably securing said testing circuit.

16. The circuit testing mechanism of claim 15 wherein said clamping device is affixed on said mounting block.

17. The circuit testing mechanism of claim 1 wherein at least one of said alignment plates is a dual layer alignment plate.

* * * * *